(12) United States Patent
Kim et al.

(10) Patent No.: US 11,696,466 B2
(45) Date of Patent: Jul. 4, 2023

(54) 3D DISPLAY APPARATUS IN WHICH A DISPLAY PANEL HAS A CURVATURE

(71) Applicant: LG Display Co., Ltd., Seoul (KR)

(72) Inventors: Young Min Kim, Goyang-si (KR); Ju Seong Park, Gimpo-si (KR); Hoon Kang, Goyang-si (KR); Keong Jin Lee, Seoul (KR); Myung Soo Park, Gimpo-si (KR); Dong Yeon Kim, Seoul (KR); Se Wan Oh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 80 days.

(21) Appl. No.: 17/363,828

(22) Filed: Jun. 30, 2021

(65) Prior Publication Data

US 2022/0020962 A1 Jan. 20, 2022

(30) Foreign Application Priority Data

Jul. 14, 2020 (KR) .................. 10-2020-0086563

(51) Int. Cl.
*H01L 51/00* (2006.01)
*H01L 27/32* (2006.01)
(Continued)

(52) U.S. Cl.
CPC ............. *H10K 50/85* (2023.02); *G02B 30/29* (2020.01); *G02B 30/32* (2020.01); *H10K 50/844* (2023.02);
(Continued)

(58) Field of Classification Search
CPC ............ H01L 51/5262; H01L 51/5253; H01L 51/0097; H01L 51/5275; H01L 51/5293; H01L 51/5048; H01L 51/5052; H01L 51/5072; H01L 51/5088; H01L 51/5092; H01L 51/5234; H01L 2251/5338; H01L 2251/301; H01L 27/3244; H01L 27/3211; H01L 27/3246; H01L 27/3295; H01L 27/3272; H01L 33/42; H01L 33/44; G02B 30/29; G02B 30/32; G02B 30/27; H04N 13/305; H10K 50/85; H10K 50/844;
(Continued)

(56) References Cited

U.S. PATENT DOCUMENTS 5,463,434 A * 10/1995 Kanayama ........... H04N 13/305
353/38
5,956,001 A * 9/1999 Sumida ................ H04N 13/337
348/E13.043
(Continued)

FOREIGN PATENT DOCUMENTS

KR 10-2020-0081911 A 7/2020

*Primary Examiner* — Ida M Soward
(74) *Attorney, Agent, or Firm* — Fenwick & West LLP

(57) ABSTRACT

A 3D display apparatus in which a display panel has a curvature is provided. A lower barrier layer, an upper barrier layer and lenticular lenses may be sequentially stacked on the display panel. The lower barrier layer and the upper barrier layer may include openings corresponding pixel areas of the display panel, respectively. Each opening of the lower barrier layer and each opening of the upper barrier layer may be disposed on an imaginary line passing through the corresponding pixel area of the display panel and a setting region. Thus, in the 3D display apparatus, the quality of the realized 3D image may be improved.

14 Claims, 5 Drawing Sheets

(51) Int. Cl.
| | |
|---|---|
| *H10K 50/85* | (2023.01) |
| *G02B 30/32* | (2020.01) |
| *G02B 30/29* | (2020.01) |
| *H10K 50/844* | (2023.01) |
| *G02B 30/10* | (2020.01) |
| *H01L 33/42* | (2010.01) |
| *H01L 33/44* | (2010.01) |
| *H10K 50/14* | (2023.01) |
| *H10K 50/16* | (2023.01) |
| *H10K 50/17* | (2023.01) |
| *H10K 50/828* | (2023.01) |
| *H10K 50/80* | (2023.01) |
| *H10K 59/12* | (2023.01) |
| *H10K 59/35* | (2023.01) |
| *H10K 59/122* | (2023.01) |
| *H10K 59/126* | (2023.01) |
| *H10K 102/00* | (2023.01) |

(52) U.S. Cl.
CPC ............ *G02B 30/10* (2020.01); *H01L 33/42* (2013.01); *H01L 33/44* (2013.01); *H10K 50/14* (2023.02); *H10K 50/16* (2023.02); *H10K 50/17* (2023.02); *H10K 50/171* (2023.02); *H10K 50/828* (2023.02); *H10K 50/868* (2023.02); *H10K 59/12* (2023.02); *H10K 59/122* (2023.02); *H10K 59/126* (2023.02); *H10K 59/35* (2023.02); *H10K 2102/00* (2023.02)

(58) Field of Classification Search
CPC ........ H10K 50/14; H10K 50/16; H10K 50/17; H10K 50/171; H10K 50/828; H10K 50/868; H10K 50/858; H10K 59/12; H10K 59/122; H10K 59/126; H10K 59/35; H10K 77/111; H10K 2102/311
See application file for complete search history.

(56) References Cited

U.S. PATENT DOCUMENTS

| | | | |
|---|---|---|---|
| 6,751,024 B1* | 6/2004 | Rosenthal | G02B 3/005 359/619 |
| 6,859,240 B1* | 2/2005 | Brown | H04N 13/305 348/E13.043 |
| 10,177,335 B2* | 1/2019 | Yamazaki | H01L 51/0096 |
| 2005/0180020 A1* | 8/2005 | Steenblik | G02B 3/0043 359/626 |
| 2006/0220025 A1* | 10/2006 | Oh | H01L 27/14636 257/E27.134 |
| 2014/0151656 A1* | 6/2014 | Zeng | C23C 16/45525 428/411.1 |
| 2016/0254487 A1* | 9/2016 | Harikrishna Mohan | C23C 30/00 428/213 |
| 2019/0326551 A1* | 10/2019 | Huang | H01L 27/1244 |
| 2021/0182526 A1* | 6/2021 | Cheng | H01L 27/14678 |

\* cited by examiner

3D DISPLAY APPARATUS IN WHICH A DISPLAY PANEL HAS A CURVATURE

CROSS-REFERENCE TO RELATED APPLICATION

This application claims the priority benefit of Republic of Korea Patent Application No. 10-2020-0086563, filed on Jul. 14, 2020, which is hereby incorporated by reference in its entirety.

BACKGROUND

Field of Technology

The present disclosure relates to a three-dimensional (3D) display apparatus in which a display panel has a curvature.

Discussion of the Related Art

Generally, a display apparatus includes a display panel realizing an image. The display panel may realize a 3D image. For example, the display apparatus may be a 3D display apparatus in which lenticular lenses are disposed on the display panel. The light emitted from each pixel area of the display panel may be superimposed in a setting region by the lenticular lenses.

The display panel may have a curved shape. For example, the display panel and the lenticular lenses may have a curvature. In the 3D display apparatus, the light emitted from the display panel may generate a repeated image at the outside of the setting region by the lenticular lenses. The 3D display apparatus may include a viewing angle control film on the lenticular lenses to prevent the generation of the repeat image. However, in the 3D display apparatus, illuminance may be decreased by the viewing angle control film and the quality of the realized 3D image may be deteriorated by a miss-align of the viewing angle control film.

SUMMARY

Accordingly, the present disclosure is directed to a 3D display apparatus that substantially obviates one or more problems due to limitations and disadvantages of the related art.

An object of the present disclosure is to provide a 3D display apparatus capable of preventing the repeated image, without the quality deterioration of the 3D image.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided a 3D display apparatus comprising a display panel. The display panel includes pixel areas. The display panel has a curvature. A lower barrier layer is disposed on the display panel. The lower barrier layer includes lower openings corresponding to the pixel areas. An upper barrier layer is disposed on the lower barrier layer. The upper barrier layer includes upper openings corresponding to the lower openings. Lenticular lenses are disposed on the upper barrier layer. Each of the lower openings and the upper openings are disposed on an imaginary line passing through the corresponding pixel area and a setting region.

The lower barrier layer, the upper barrier layer and the lenticular lenses may have the same curvature as the display panel.

Y axis may be defined as a line passing through the curvature center of the display panel and the setting region. X axis may be defined as a line passing through the curvature center of the display panel in a direction perpendicular to the Y axis. The upper opening corresponding to the pixel area having the position coordinates of $(PA_x, PA_y)$ may have the position coordinates of $(OP_x, OP_y)$ satisfying the below equations 1 to 3.

$$OP_x = \frac{\sqrt{m_1^2(g_2+R)^2 + (g_2^2 - D)(g_2 + D + 2R)} - m_1(R+D)}{m_1^2 + 1} \quad \text{[Equation 1]}$$

$$OP_y = m_1 OP_x + (R+D) \quad \text{[Equation 2]}$$

$$m_1 = \frac{PA_y - (R+D)}{PA_x} \quad \text{[Equation 3]}$$

(Herein, R is the curvature radius of the display panel, $g_2$ is the straight distance between the pixel area of the display panel and the upper barrier layer, and D is the straight distance between the center position of the display panel and the setting region)

The curvature center of the display panel may have position coordinates of (0, 0). The setting region may have position coordinates of (0, R+D).

The pixel areas may include a first pixel area and a second pixel area adjacent the first pixel area. The upper openings may include a first upper opening corresponding to the first pixel area and a second upper opening corresponding to the second pixel area. The lower barrier layer may include a barrier pattern. The barrier pattern of the lower barrier layer may be disposed on an imaginary line passing through the halfway point between the first pixel area and the second pixel area, and the halfway point between the first upper opening and the second upper opening.

The first pixel may have the position coordinates of $(PA1_x, PA1_y)$. The second pixel may have the position coordinates of $(PA2_x, PA2_y)$. The first upper openings may have the position coordinates of $(OP1_x, OP1_y)$. The second upper openings may have the position coordinates of $(OP2_x, OP2_y)$. The barrier pattern may have the position coordinates of $(BP_x, BP_y)$ satisfying the below equations 4 to 7.

$$BP_x = \frac{\sqrt{m_2^2 c^2 + (R + g_1 - c)(R + g_1 + c)} - m_2 c}{m_2^2 + 1} \quad \text{[Equation 4]}$$

$$BP_y = m_2 BP_x + c \quad \text{[Equation 5]}$$

$$m_2 = \frac{PA1_y + PA2_y - OP1_y - OP2_y}{PA1_x + PA2_x - OP1_x - OP2_x} \quad \text{[Equation 6]}$$

$$c = \frac{PA1_y + PA2_y}{2} - \frac{m_2(PA1_x + PA2_x)}{2} \quad \text{[Equation 7]}$$

(Herein, $g_1$ is the straight distance between the pixel area of the display panel and the lower barrier layer)

The width of each upper opening may be the same as the width of the corresponding lower opening.

The width of each lower opening may be the same as the width of the corresponding pixel area.

The pixel areas may be disposed side by side in a first direction and a second direction perpendicular to the first direction. Each of the lenticular lenses may extend obliquely to the first direction. The display panel may include light-blocking patterns overlapping with the boundary of the lenticular lenses.

Each of the light-blocking patterns may extend in the same direction as the lenticular lenses.

The display panel may include a device substrate, a light-emitting device and an encapsulating element. The light-emitting device may be disposed on the device substrate. The encapsulating element may be disposed on the light-emitting device. The light-blocking patterns may be disposed in the encapsulating element.

A quarter-wave plate and a linear polarizing plate may be stacked between the upper barrier layer and the lenticular lenses. The lower barrier layer may be in contact with the encapsulating element and the upper barrier layer.

Each of the upper openings may be spaced away from the imaginary passing through the curvature center of the display panel and the setting region by a first straight distance, when the display panel and the upper barrier layer are spread flat. Each of the upper openings may be spaced away from the imaginary line passing through the curvature center of the display panel and the setting region by a second straight distance, when the display panel and the upper barrier layer have the curvature. The first straight distance may be smaller than the second straight distance.

The upper opening having the position coordinates of ($OP_x$, $OP_y$) may be spaced away from the imaginary line passing through the curvature center of the display panel and the setting region by the straight distance $d_{cal}$ satisfying the below equations 8 and 9.

$$d_{cal} = \frac{R}{R+g_2} d_{ori} \qquad \text{[Equation 8]}$$

$$d_{ori} = (R+g_2)\tan^{-1}\left(\frac{OP_x}{OP_y}\right) \qquad \text{[Equation 9]}$$

(Herein, R is the curvature radius of the display panel, $g_2$ is the straight distance between the pixel area of the display panel and the upper barrier layer, and $d_{ori}$ is the arc distance between the imaginary line passing through the center position of the display panel and the setting region and the upper opening, when the display panel and the upper barrier layer have the curvature)

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
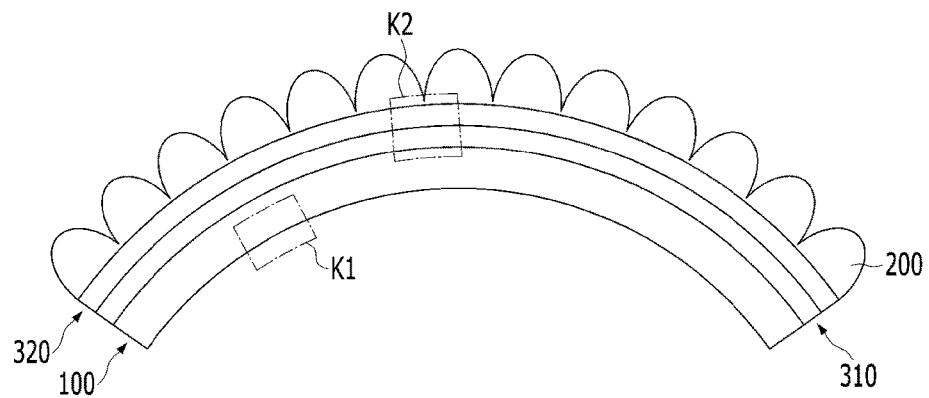
FIG. 1 is a view schematically showing a 3D display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
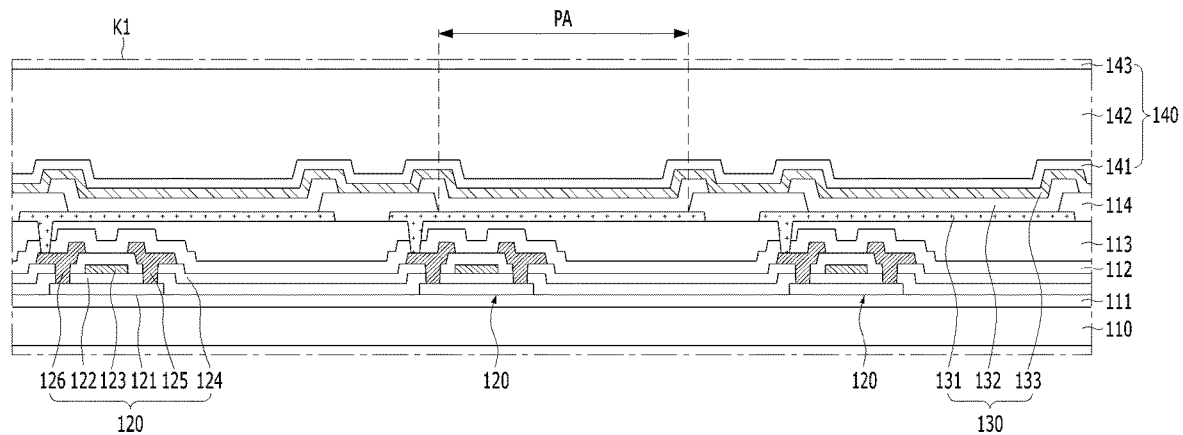
FIG. 2 is an enlarged view of K1 region in FIG. 1 according to an embodiment of the present disclosure.
Figure 3:
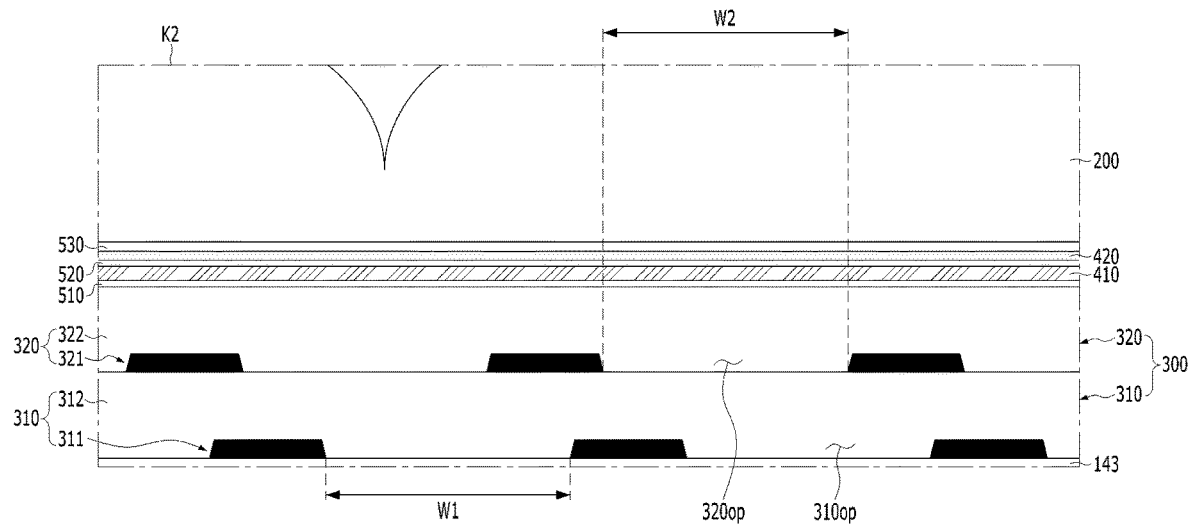
FIG. 3 is an enlarged view of K2 region in FIG. 1 according to an embodiment of the present disclosure.

FIG. 1 is a view schematically showing a 3D display apparatus according to an embodiment of the present disclosure. FIG. 2 is an enlarged view of K1 region in FIG. 1. FIG. 3 is an enlarged view of K2 region in FIG. 1 according to an embodiment of the present disclosure.

Referring to FIGS. 1 to 3, the 3D display apparatus according to the present disclosure may include a display panel 100. The display panel 100 may realize an image provided to a user. For example, the display panel 100 may include pixel areas PA.

Each of the pixel areas PA may display a specific color. For example, a light-emitting device 130 on a device substrate 110 may be disposed in each pixel area PA. The device substrate 110 may include an insulating material. For example, the device substrate 110 may include glass or plastic.

The light-emitting device 130 may emit light displaying a specific color. For example, the light-emitting device 130 may include a first electrode 131, a light-emitting layer 132 and a second electrode 133, which are sequentially stacked on the device substrate 110.

The first electrode 131 may include a conductive material. The first electrode 131 may include a material having high reflectance. For example, the first electrode 131 may include a metal, such as aluminum (Al) and/or silver (Ag). The first electrode 131 may have a multi-layer structure. For example, the first electrode 131 may have a structure in which the reflective electrode formed of a metal is disposed between transparent electrodes formed of a transparent conductive material, such as ITO and IZO.

The light-emitting layer 132 may generate light having luminance corresponding to a voltage difference between the first electrode 131 and the second electrode 133. For example, the light-emitting layer 132 may be an emission material layer (EML) having an emission material. The emission material may be an organic material. For example, the display panel 100 of the 3D display apparatus according to the embodiment of the present disclosure may be an OLED panel including the light-emitting layer 132 of an organic material. The light-emitting layer 132 may have a multi-layer structure to increase the luminous efficiency. For example, the light-emitting layer 132 further include at least one of a hole injection layer (HIL), a hole transmitting layer (HTL), an electron transmitting layer (ETL) and an electron injection layer (EIL).

The second electrode 133 may include a conductive material. The second electrode 133 may include a material different from the first electrode 131. For example, the second electrode 133 may be a transparent electrode formed of a transparent conductive material, such as ITO and IZO. Thus, in the display panel 100 of the 3D display apparatus according to the embodiment of the present disclosure, the light generated by the light-emitting layer 132 may be emitted to outside through the second electrode 133.

A driving circuit may be disposed between the device substrate 110 and the light-emitting device 130. The driving circuit may supply a driving current corresponding to a data signal according to a scan signal. For example, the driving circuit may include at least one thin film transistor 120. The thin film transistor 120 may include a semiconductor pattern 121, a gate insulating layer 122, a gate electrode 123, an interlayer insulating layer 124, a source electrode 125 and a drain electrode 126.

The semiconductor pattern 121 may be disposed close to the device substrate 110. The semiconductor pattern 121 may include a semiconductor material. For example, the semiconductor pattern 121 may include silicon. The semiconductor pattern 121 may be an oxide semiconductor. For example, the semiconductor pattern 121 may include a metal oxide, such as IGZO. The semiconductor pattern 121 may include a channel region between a source region and a drain region. The source region and the drain region may have an electric conductivity higher than the channel region.

The gate insulating layer 122 may be disposed on the semiconductor pattern 121. The gate insulating layer 122 may extend beyond the semiconductor pattern 121. For example, a side surface of the semiconductor pattern 121 may be covered by the gate insulating layer 122. The gate insulating layer 122 may include an insulating material. For example, the gate insulating layer 122 may include silicon oxide or silicon nitride. The gate insulating layer 122 may include a High-K material. For example, the gate insulating layer 122 may include titanium oxide. The gate insulating layer 122 may have a multi-layer structure.

The gate electrode 123 may be disposed on the gate insulating layer 122. The gate electrode 123 may overlap the channel region of the semiconductor pattern 121. For example, the channel region of the semiconductor pattern 121 may have an electrical conductivity corresponding to a voltage applied to the gate electrode 123. The gate electrode 123 may be insulated from the semiconductor pattern 121 by the gate insulating layer 122. The gate electrode 123 may include a conductive material. For example, the gate electrode 123 may include a metal, such as aluminum (Al), chrome (Cr), copper (Cu), Titanium (Ti), molybdenum (Mo) or tungsten (W).

The interlayer insulating layer 124 may be disposed on the gate electrode 123. The interlayer insulating layer 124 may extend beyond the semiconductor pattern 121. For example, a side surface of the gate electrode 123 may be covered by the interlayer insulating layer 124. The interlayer insulating layer 124 may include an insulating material. For example, the interlayer insulating layer 124 may include silicon oxide.

The source electrode 125 may be disposed on the interlayer insulating layer 124. The source electrode 125 may be electrically connected to the source region of the semiconductor pattern 121. For example, the gate insulating layer 122 and the interlayer insulating layer 124 may include a source contact hole partially exposing the source region of the semiconductor pattern 121. The source electrode 125 may be in direct contact with the source region of the semiconductor pattern 121 in the source contact hole. The source electrode 125 may include a conductive material. For example, the source electrode 125 may include a metal, such as aluminum (Al), chrome (Cr), copper (Cu), Titanium (Ti), molybdenum (Mo) or tungsten (W). The source electrode 125 may include a material different from the gate electrode 123.

The drain electrode 126 may be disposed on the interlayer insulating layer 124. The drain electrode 126 may be electrically connected to the drain region of the semiconductor pattern 121. The drain electrode 126 may be spaced away from the source electrode 125. For example, the gate insulating layer 122 and the interlayer insulating layer 124 may include a drain contact hole partially exposing the drain region of the semiconductor pattern 121. The drain electrode 126 may be in direct contact with the drain region of the semiconductor pattern 121 in the drain contact hole. The drain electrode 126 may include a conductive material. For example, the drain electrode 126 may include a metal, such as aluminum (Al), chrome (Cr), copper (Cu), Titanium (Ti), molybdenum (Mo) or tungsten (W). The drain electrode 126 may include the same material as the source electrode 125. The drain electrode 126 may include a material different from the gate electrode 123.

A buffer layer 111 may be disposed between the device substrate 110 and the driving circuit. The buffer layer 111 may prevent or at least reduce pollution to the device substrate 110 during a process of forming the driving circuit. For example, the buffer layer 111 may be disposed between the device substrate 110 and the semiconductor pattern 121. The buffer layer 111 may extend beyond the semiconductor pattern 121. For example, an entirely surface of the device substrate 110 toward the driving circuit may be covered by the buffer layer 111. The buffer layer 111 may include an insulating material. For example, the buffer layer 111 may include silicon oxide and/or silicon nitride.

A lower passivation layer 112 may be disposed between the driving circuit and the light-emitting device 130. The lower passivation layer 112 may prevent or at least reduce the damage of the driving circuit due to external impact and moisture. For example, the lower passivation layer 112 may cover an entirely surface of the driving circuit toward the light-emitting device 130. The lower passivation layer 112 may extend beyond the source electrode 125 and the drain electrode 126. The lower passivation layer 112 may include an insulating material. For example, the lower passivation layer 112 may include silicon oxide and/or silicon nitride.

An over-coat layer 113 may be disposed between the lower passivation layer 112 and the light-emitting device 130. The over-coat layer 113 may remove or at least reduce a thickness difference due to the driving circuit. For example, a surface of the over-coat layer 113 opposite to the device substrate 110 may be a flat surface. The over-coat layer 113 may extend along the lower passivation layer 112. The over-coat layer 113 may include an insulating material. For example, the over-coat layer 113 may include an organic material.

The light-emitting device 130 may be electrically connected to the driving circuit. For example, the lower passivation layer 112 and the over-coat layer 113 may include an electrode contact hole exposing a portion of the thin film transistor 120. The driving current generated by the driving circuit may be applied to the first electrode 131 of the light-emitting device 130. For example, the first electrode 131 of the light-emitting device 130 may be in direct contact with the drain electrode 126 of the thin film transistor 120 in the electrode contact hole.

An encapsulating element 140 may be disposed on the light-emitting device 130. For example, the light-emitting device 130 may be disposed between the device substrate 110 and the encapsulating element 140. The encapsulating element 140 may prevent or at least reduce the damage of the light-emitting device 130 due to the external impact and moisture. The encapsulating element 140 may extend beyond the light-emitting device 130. For example, the second electrode 133 of the light-emitting device 130 may be covered by the encapsulating element 140.

The encapsulating element 140 may have a multi-layer structure. For example, the encapsulating element 140 may include a first encapsulating layer 141, a second encapsulating layer 142 and a third encapsulating layer 143, which are sequentially stacked on the second electrode 133 of the light-emitting device 130. The first encapsulating layer 141, the second encapsulating layer 142 and the third encapsulating layer 143 may include an insulating material. The second encapsulating layer 142 may include a material different from the first encapsulating layer 141 and the third encapsulating layer 143. For example, the first encapsulating layer 141 and the third encapsulating layer 143 may include an inorganic material, and the second encapsulating layer 142 may include an organic material. Thus, in the display panel 100 of the 3D display apparatus according to the embodiment of the present disclosure, the permeation of the external moisture may be effectively prevented or at least reduced. A thickness difference due to the light-emitting device 130 may be removed by the second encapsulating layer 142. For example, a surface of the third encapsulating layer 143 opposite to the device substrate 110 may be a flat surface.

The light-emitting device 130 of each pixel area PA may be controlled independently from the light-emitting device 130 of adjacent pixel area PA. For example, a bank insulating layer 114 may be disposed between adjacent pixel areas PA. The first electrode 131 of each pixel area PA may be insulated from the first electrode 131 of adjacent pixel area PA by the bank insulating layer 114. For example, the bank insulating layer 114 may cover an edge of each first electrode 131. The light-emitting layer 132 and the second electrode 133 of each pixel area PA may be stacked on a portion of the corresponding first electrode 131 exposed by the bank insulating layer 114. The bank insulating layer 114 may include an insulating material. For example, the bank insulating layer 114 may include an organic material. The bank insulating layer 114 may include a material different from the over-coat layer 113.

The light-emitting device 130 of each pixel area PA may realize a color different from the light-emitting device 130 of adjacent pixel area PA. For example, the light-emitting layer 132 of each light-emitting device 130 may include a material different from the light-emitting layer 132 of adjacent light-emitting device 130. The light-emitting layer 132 of each light-emitting device 130 may be spaced away from the light-emitting layer 132 of adjacent light-emitting device 130. For example, the light-emitting layer 132 of each light-emitting device 130 may include an end on the bank insulating layer 114.

A voltage applied to the second electrode 133 of each pixel area PA may be the same as a voltage applied to the second electrode 133 of adjacent pixel area PA. For example, the second electrode 133 of each light-emitting device 130 may be electrically connected to the second electrode 133 of adjacent light-emitting device 130. The second electrode 133 of each light-emitting device 130 may include the same material as the second electrode 133 of adjacent light-emitting device 130. For example, the second electrode 133 of each light-emitting device 130 may be in contact with the second electrode 133 of adjacent light-emitting device 130. The bank insulating layer 114 may be covered by the second electrode 133.

Lenticular lenses 200 may be disposed on the display panel 100. The lenticular lenses 200 may realize the 3D image in a setting region by using the light emitted from each pixel area PA of the display panel 100. For example, the 3D display apparatus according to the embodiment of the present disclosure may be a light field display apparatus (LFD) in which the light emitted from each pixel area of the display panel is superimposed in the setting region by the lenticular lenses.

A barrier element 300 may be disposed between the display panel 100 and the lenticular lenses 200. The barrier element 300 may have a multi-layer structure. For example, the barrier element 300 may have a stacked structure of a lower barrier layer 310 and an upper barrier layer 320.

The lower barrier layer 310 may be disposed adjacent to the display panel 100. For example, the lower barrier layer 310 may be disposed between the display panel 100 and the upper barrier layer 320. The lower barrier layer 310 may include lower barrier patterns 311 and lower openings 311op disposed between the lower barrier pattern 311.

The lower barrier patterns 311 may include a light-blocking material. For example, the lower barrier patterns 311 may include a metal. The lower barrier patterns 311 may include a low-reflective material. For example, the lower barrier patterns 311 may include a black dye. Thus, in the 3D display apparatus according to the embodiment of the present disclosure, the light emitted from each pixel area PA of the display panel 100 may pass through one of the lower openings 311op of the lower barrier layer 310. The lower openings 311op may be corresponding to the pixel areas PA of the display panel 100. For example, each of the lower openings 311op may have the same width as the corresponding pixel area PA of the display panel 100.

The lower barrier layer 310 may be formed using a process of forming the display panel 100. For example, the step of forming the lower barrier layer 310 may include a process of forming a light-blocking layer on the encapsulating element 140 of the display panel 100 and a process of forming the lower barrier pattern 311 by patterning the light-blocking layer. The lower barrier pattern 311 may be in direct contact with the third encapsulating layer 143 of the display panel 100.

The upper barrier layer 320 may be disposed on the lower barrier layer 310. For example, the upper barrier layer 320 may be disposed between the lower barrier layer 310 and the lenticular lenses 200. The upper barrier layer 320 may include upper barrier patterns 321 and upper openings 321op between the upper barrier patterns 321.

The upper barrier patterns 321 may include a light-blocking material. For example, the upper barrier patterns 321 may include a metal. The upper barrier patterns 321 may have a low-reflective material. For example, the upper barrier patterns 321 may include a black dye. The upper barrier patterns 321 may include the same material as the lower barrier pattern 311. Thus, in the 3D display apparatus according to the embodiment of the present disclosure, the light emitted from each pixel area PA of the display panel 100 may pass through the corresponding lower opening 311op and the corresponding upper opening 321op, and may travel toward the lenticular lenses 200. The upper openings 321op may be corresponding to the lower openings 311op. For example, the width W2 of each upper opening 321op may be the same as the width W1 of each lower opening 311op. Therefore, in the 3D display apparatus according to the embodiment of the present disclosure, decreasing the luminance of the light emitted from each pixel area PA of the display panel 100 due to the barrier element 300 may be prevented or at least reduced.

The upper barrier layer 320 may be formed using a process of forming the display panel 100. For example, the step of forming the upper barrier layer 320 may include a process of forming a light-blocking layer on the lower barrier layer 310, and a process of forming the upper barrier patterns 321 by patterning the light-blocking layer.

A surface of the upper barrier layer 320 toward the display panel 100 may be parallel with a surface of the display panel 100 toward the lenticular lenses 200. For example, the lower barrier layer 310 may include a lower planarizing layer 312 covering the lower barrier patterns 311. The lower planarizing layer 312 may remove a thickness difference by the lower barrier pattern 311. A surface of the lower planarizing layer 312 toward the lenticular lenses 200 may be a flat surface. For example, the lower openings 311op may be filled by the lower planarizing layer 312. The lower planarizing layer 312 may include an insulating material. For example, the lower planarizing layer 312 may include an organic material. The lower barrier layer 310 may be in direct contact with the display panel 100 and the upper barrier layer 320. For example, the upper barrier pattern 321 may be in direct contact with the lower planarizing layer 312.

A quarter-wave plate 410 and a linear polarizing plate 420 may be stacked between the barrier element 300 and the lenticular lenses 200. The quarter-wave plate 410 and the linear polarizing plate 420 may prevent the reflection of the external light by the display panel 100. For example, the linear polarizing plate 420 may be disposed between the quarter-wave plate 410 and the lenticular lenses 200. A surface of the quarter-wave plate 410 toward the display panel 100 may be flat. For example, the upper barrier layer 320 may include an upper planarizing layer 322 covering the upper barrier patterns 321. The upper planarizing layer 322 may remove a thickness difference due to the upper barrier pattern 321. For example, the upper openings 321op may be filled by the upper planarizing layer 322. The upper planarizing layer 322 may include an insulating material. For example, the upper planarizing layer 322 may include an organic material. The upper planarizing layer 322 may include the same material as the lower planarizing layer 312. The upper barrier layer 320 may fill a space between the lower barrier layer 310 and the quarter-wave plate 410, completely. For example, the quarter-wave plate 410 may be in direct contact with the upper planarizing layer 322.

The quarter-wave plate 410, the linear polarizing plate 420 and the lenticular lenses 200 may be fixed on the barrier element 300. For example, in the 3D display apparatus according to the embodiment of the present disclosure, the quarter-wave plate 410 may be attached to the upper barrier layer 320 by a first adhesive layer 510, the linear polarizing layer 420 may be attached to the quarter-wave plate 410 by a second adhesive layer 520, and the lenticular lenses 200 may be attached to the linear polarizing layer 420 by a third adhesive layer 530. Thus, in the 3D display apparatus according to the embodiment of the present disclosure, an air-gap may be not formed between the display panel 100 and the lenticular lenses 200.

The first adhesive layer 510, the second adhesive layer 520 and the third adhesive layer 530 may include different materials. For example, the refractive index of the first adhesive layer 510 may be different from the refractive index of the second adhesive layer 520 and/or the refractive index of the third adhesive layer 530. The first adhesive layer 510 may have the refractive index between the upper planarizing layer 322 of the upper barrier layer 320 and the quarter-wave plate 410. The second adhesive layer 520 may have the refractive index between the quarter-wave plate 410 and the linear polarizing plate 420. The third adhesive layer 530 may have the refractive index between the linear polarizing plate 420 and the lenticular lenses 200. For example, the first adhesive layer 510 may have the same refractive index as the quarter-wave plate 410, and the second adhesive layer 520 and the third adhesive layer 530 may have the same refractive index as the linear polarizing plate 420. Therefore, in the 3D display apparatus according to the embodiment of the present disclosure, the loss of the light due to abrupt change in the refractive index may be prevented.

Figure 4:
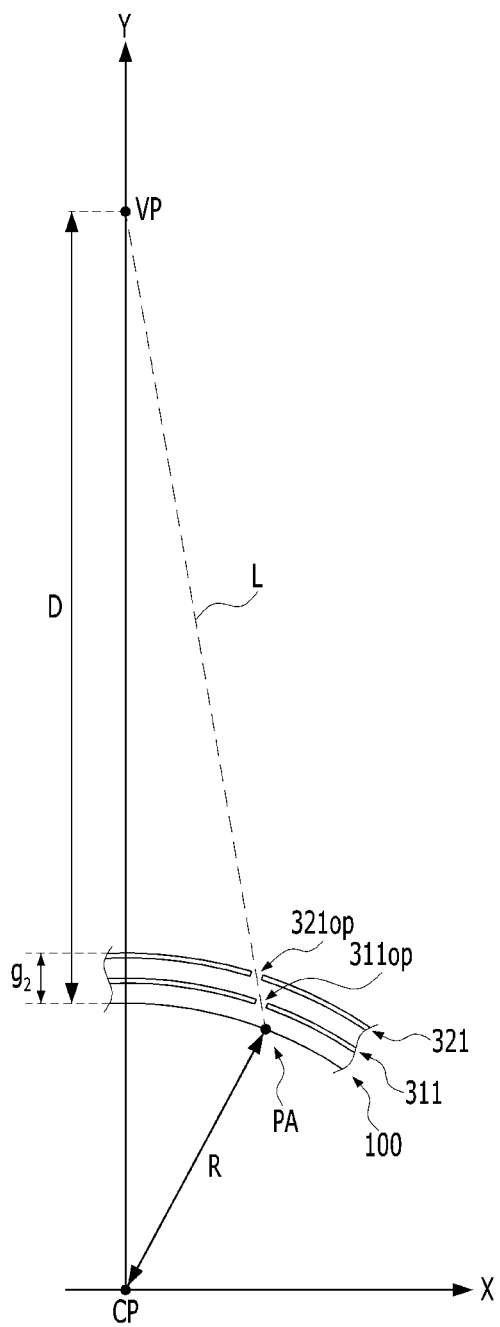
FIGS. 4 and 5 are views for explaining the relative positions of openings disposed in the lower barrier layer and the upper barrier layer of the 3D display apparatus according to the embodiment of the present disclosure.

In the 3D display apparatus according to the embodiment of the present disclosure, the light emitted from each pixel area PA of the display panel 100 may pass through one of the lower openings 311op and one of the upper openings 321op. That is, in the 3D display apparatus according to the embodiment of the present disclosure, each of the lower openings 311op and each of the upper openings 321op may be disposed on an imaginary line coupling to the corresponding pixel area PA and the setting region VP, as shown in FIG. 4. For example, when Y axis is defined as a line passing through the curvature center CP of the display panel 100 and the setting region VP, X axis is defined as a line passing through the curvature center CP of the display panel 100 perpendicular to the Y axis, and the pixel area PA has the position coordinates of $(PA_x, PA_y)$, the upper opening 321op corresponding to the pixel area PA may have the position coordinates of $(OP_x, OP_y)$ satisfying the below equation 1 to 3. Herein, R is the curvature radius of the display panel 100, $g_2$ is the straight distance between the pixel area PA of the display panel 100 and the upper barrier layer 320, and D is the straight distance between the center position of the display panel 100 and the setting region VP. For example, the curvature center CP of the display panel 100 may have the position coordinates of (0, 0), and the setting region VP may have the position coordinates of (0, R+D). Thus, in the 3D display apparatus according to the embodiment of the present disclosure, the direction of the light emitted from each pixel area PA of the display panel 100 may be controlled by the upper openings 321op of the upper barrier layer 320.

$$OP_x = \frac{\sqrt{m_1^2(g_2+R)^2 + (g^2-D)(g_2+D+2R)} - m_1(R+D)}{m_1^2+1}$$ [Equation 1]

$$OP_y = m_1 OP_x + (R+D)$$ [Equation 2]

$$m_1 = \frac{PA_y - (R+D)}{PA_x}$$ [Equation 3]

Figure 5:
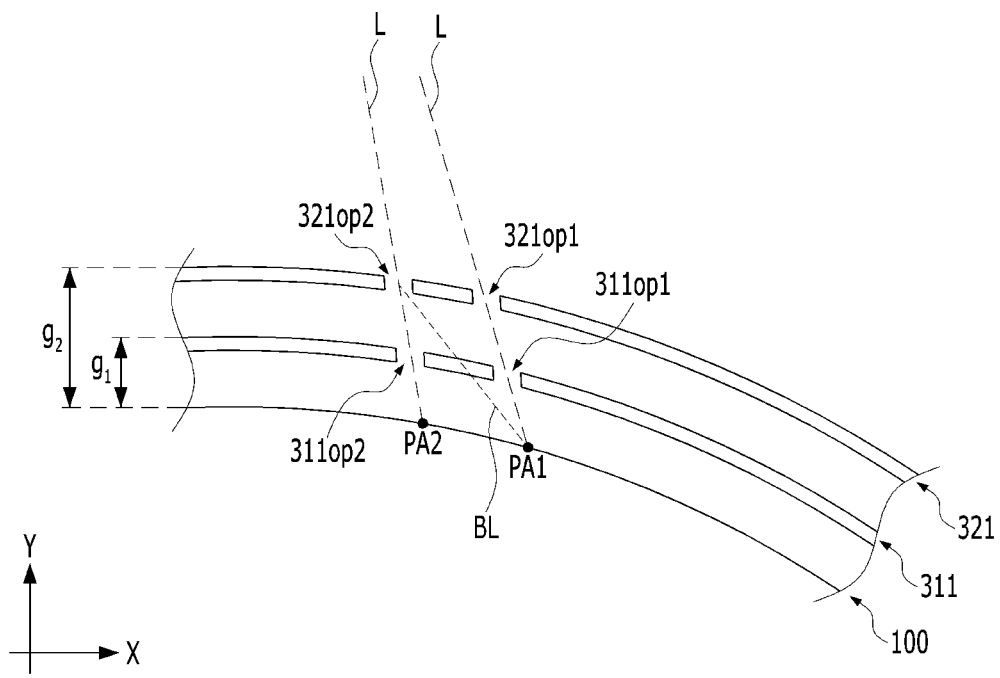

Also, in the 3D display apparatus according to the embodiment of the present disclosure, when the pixel areas include a first pixel area PA1 and a second pixel area PA2 adjacent the first pixel area PA1, and the upper openings include a first upper opening 321op1 corresponding to the first pixel area PA1 and a second upper opening 321op2 corresponding to the second pixel area PA2, the lower barrier layer 310 may include the lower barrier pattern 311 which is disposed on an imaginary line passing through a halfway point between the first pixel area PA1 and the second pixel area PA2, and a halfway point between the first upper opening 321op1 and the second upper opening 321op2, as shown in FIG. 5. For example, when the first pixel area PA1 has the position coordinates of $(PA1_x, PA1_y)$, the second pixel area PA2 has the position coordinates of $(PA2_x, PA2_y)$, the first upper opening has the position coordinates of $(OP1_x, OP1_y)$, and the second upper opening has the position coordinates of $(OP2_x, OP2_y)$, the lower barrier pattern 311 of the lower barrier layer 320 may be disposed on the position coordinates of $(BP_x, BP_y)$, which is determined by the below equations 4 to 7. Herein, each of the upper openings 321op1 and 321op2 may be disposed on an imaginary line L coupled between the corresponding pixel area PA1 and PA2 and the setting region. Further, $g_1$ is the straight distance between the pixel area PA of the display panel 100 and the lower barrier layer 310. Thus, in the 3D display apparatus according to the embodiment of the present disclosure, the interference of the light emitted from adjacent pixel areas PA1 and PA2 may be prevented by the lower barrier patterns 311 of the lower barrier layer 310.

$$BP_x = \frac{\sqrt{m_2^2 c^2 + (R+g_1-c)(R+g_1+c)} - m_2 c}{m_2^2+1}$$ [Equation 4]

$$BP_y = m_2 BP_x + c$$ [Equation 5]

$$m_2 = \frac{PA1_y + PA2_y - OP1_y - OP2_y}{PA1_x + PA2_x - OP1_x - OP2_x}$$ [Equation 6]

$$c = \frac{PA1_y + PA2_y}{2} - \frac{m_2(PA1_x + PA2_x)}{2}$$ [Equation 7]

Accordingly, in the 3D display apparatus according to the embodiment of the present disclosure, the lower barrier layer 310 and the upper barrier layer 320 disposed between the display panel 100 and the lenticular lenses 20 may respectively include the openings 311op and 321op corresponding to the pixel areas PA of the display panel 100, and the direction of the light emitted from each pixel area PA may be controlled by the lower openings 311op of the lower barrier layer 310 and the upper openings 321op of the upper barrier layer 320. Thus, in the 3D display apparatus according to the embodiment of the present disclosure, the generation of a repeated image outside the setting region VP may be prevented.

In the 3D display apparatus according to the embodiment of the present disclosure, the interference of the light emitted from adjacent pixel areas PA may be prevented by the lower barrier patterns 311 of the lower barrier layer 310. And, in the 3D display apparatus according to the embodiment of the present disclosure, the lower barrier layer 310 and the upper barrier layer 320 may be formed on the encapsulating element 140 using a process of forming the display panel 100. Thus, in the 3D display apparatus according to the embodiment of the present disclosure, the miss-align of the lower openings 311op of the lower barrier layer 310 and the upper openings 321op of the upper barrier layer 320 may be reduced. Therefore, in the 3D display apparatus according to the embodiment of the present disclosure, the decrease illuminance and the quality deterioration of the 3D image realized in the setting region VP may be prevented or at least reduced.

Figure 6:
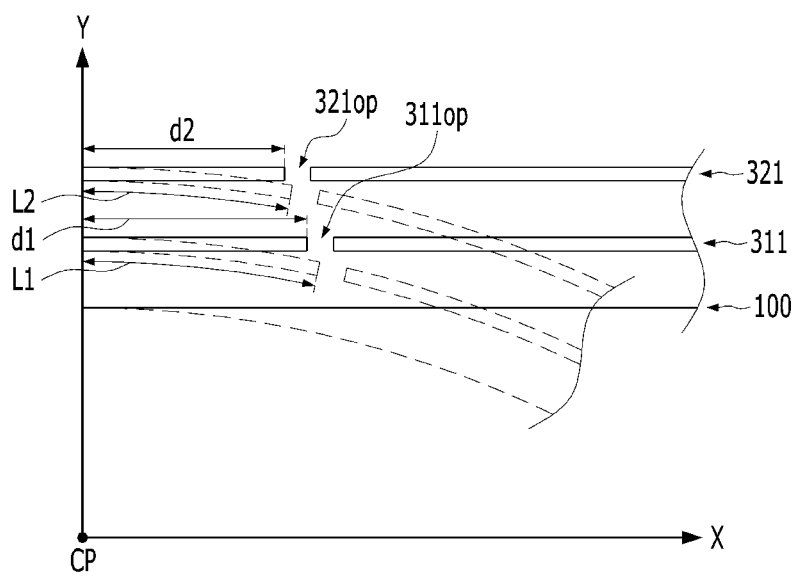
FIG. 6 is a view schematically showing a path of light in the 3D display apparatus according to the embodiment of the present disclosure.

A method of forming the 3D display apparatus according to the embodiment of the present disclosure may include a step of forming the barrier element 300 on the display panel 100 having a flat shape, a step of stacking the lenticular lenses 200 on the barrier element 300, and a step of bending the display panel 100, the barrier element 300 and the lenticular lenses 200 to a certain curvature. For example, in the 3D display apparatus according to the embodiment of the present disclosure, the lower barrier layer 310, the upper barrier layer 320 and the lenticular lenses 300 may have the same curvature as the display panel 100. In the 3D display apparatus according to the embodiment of the present disclosure, since the lower barrier layer 310 and the upper barrier layer 320 are formed on the encapsulating element 140 of the display panel 100, the lower barrier layer 310 and the upper barrier layer 320 may extend in a direction of the arc distance during a step of bending. For example, in the 3D display apparatus according to the embodiment of the present disclosure, the straight distance d1 between the Y axis and each lower opening 311op and the straight distance d2 between the Y axis and each upper opening 321op when the display panel 100 is a flat shape may be respectively smaller than the arc distance L1 between the Y axis and the corresponding lower opening 311op and the arc distance L2 between the Y axis and the corresponding upper opening 321op when the display panel 100 has the curvature, as shown in FIG. 6. Thus, in the 3D display apparatus according to the embodiment of the present disclosure, the location of each opening 311op and 321op may be corrected during the formation process of the barrier element 300. For example, the upper opening 321op having the position coordinates of ($OP_x$, $OP_y$) with respect to the Y axis and the X axis may be formed to be spaced away from the Y axis by the straight distance $d_{cal}$ satisfying the below equations 8 and 9. Herein, $d_{ori}$ is the same value as the arc distance L2 between the Y axis and the corresponding upper opening 321op, when the display panel 100 has the curvature.

$$d_{cal} = \frac{R}{R+g_2} d_{ori} \qquad \text{[Equation 8]}$$

$$d_{ori} = (R+g_2)\tan^{-1}\left(\frac{OP_x}{OP_y}\right) \qquad \text{[Equation 9]}$$

Figure 7:
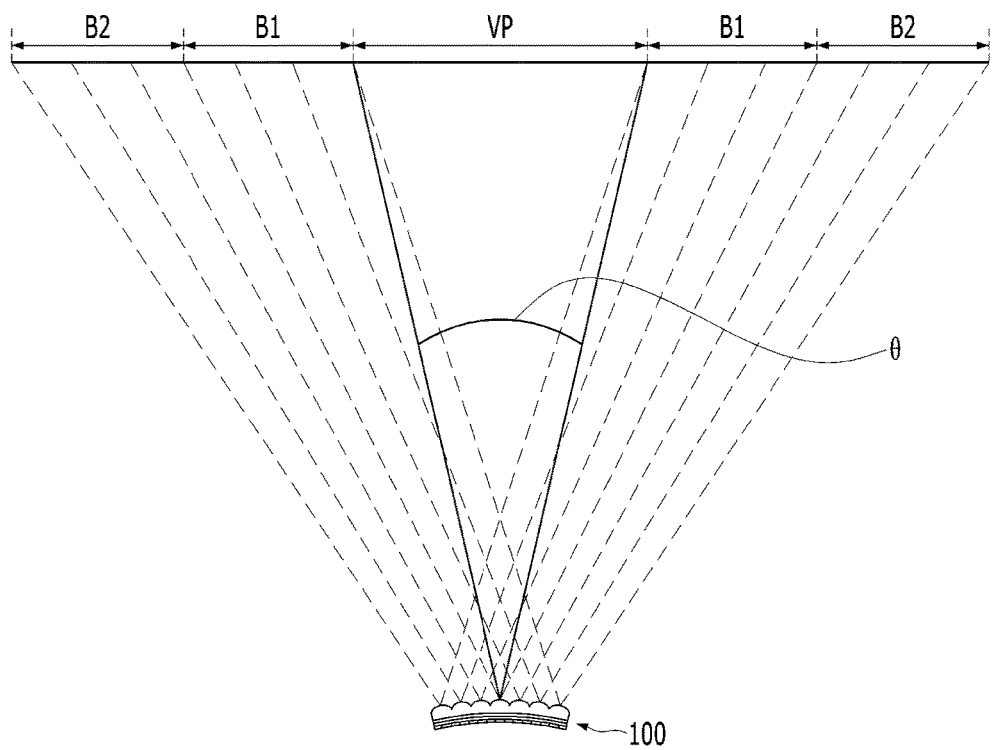
FIG. 7 is a view for explaining the position of each opening according to the shape of the display panel, the lower barrier layer and the upper barrier layer in the 3D display apparatus according to the embodiment of the present disclosure.

In the 3D display apparatus according to the embodiment of the present disclosure, the lenticular lenses 200 may extend obliquely to the arrangement direction of the pixel areas PA. For example, some of the pixel areas PA may overlap the boundary of the lenticular lenses 200. The display apparatus according to the embodiment of the present disclosure may control the operation of the pixel areas PA to prevent the generation of a partial image due to the light passing through an edge of each lenticular lens 200. For example, in the 3D display apparatus according to the embodiment of the present disclosure, the light may be not emitted from the pixel areas PA overlapping with the boundary of the lenticular lenses 200. Thus, in the 3D display apparatus according to the embodiment of the present disclosure, the angle of the light passing through the lenticular lenses 200 may be limited. For example, in the 3D display apparatus according to the embodiment of the present disclosure, the partial image generated by the light which passes through the edge of each lenticular lenses 200 and is superimposed in a first region B1 adjacent the setting region VP may be prevented by the control of the pixel areas PA, and the repeated image generated in a second region B2 disposed outside the first region B1 may be prevented or at least reduced by the barrier element 300, as shown in FIG. 7. Therefore, in the 3D display apparatus according to the embodiment of the present disclosure, the quality of the 3D image realized in the setting region VP may be improved.

Figure 8:
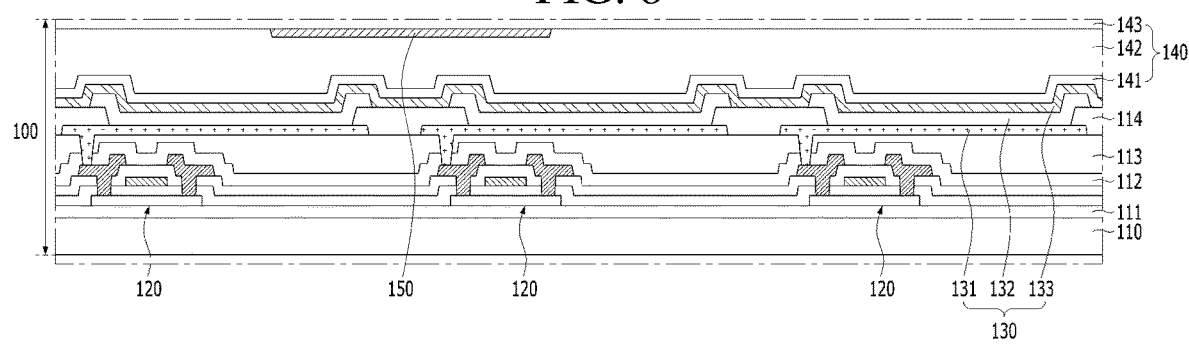
FIGS. 8 and 9 are views showing the 3D display apparatus according to another embodiment of the present disclosure.
Figure 9:
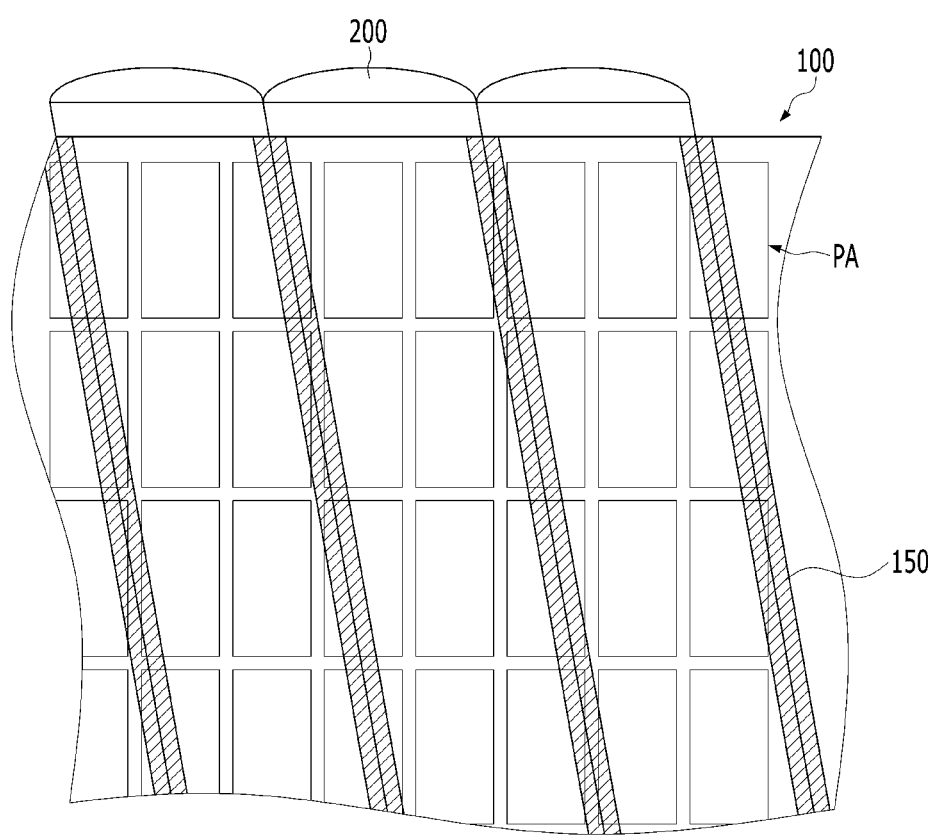

The display panel 100 of the 3D display apparatus according to another embodiment of the present disclosure may further include light-blocking patterns 150 to prevent the generation of the partial image in the first region B1, as shown in FIGS. 8 and 9. For example, the light-blocking pattern 150 may overlap the boundary of the lenticular lenses 200. The display panel 100 may include the pixel areas PA which are disposed side by side in a first direction and a second direction perpendicular to the first direction. For example, the pixel areas PA may be arranged in a matrix shape. Each of the lenticular lenses 200 may extend obliquely to the first direction. Each of the light-blocking patterns 150 may extend parallel with the lenticular lenses 200. The light-blocking patterns 150 may include a light-blocking material. For example, the light-blocking patterns 150 may include a metal. The light-blocking patterns 150 may include a low reflective material. For example, the light-blocking patterns 150 may include a black dye. The light-blocking patterns 150 may include the same material as the lower barrier patterns and the upper barrier patterns. Thus, in the 3D display apparatus according to another embodiment of the present disclosure, the light emitted to the boundary of the lenticular lenses 200 from each pixel area PA of the display panel 100 may be blocked by the light-blocking patterns 150. Therefore, in the 3D display apparatus according to another embodiment of the present disclosure, the driving method of the pixel areas PA may be simplified, and the light extraction efficiency may be improved.

The light-blocking pattern 150 may be formed in the display panel 100. For example, the light-blocking pattern 150 may be disposed between the second encapsulating layer 142 and the third encapsulating layer 143 of the encapsulating element 140. The second encapsulating layer 142 may include grooves accommodating the light-blocking patterns 150. Thus, in the 3D display apparatus according to another embodiment of the present disclosure, the increase in the thickness due to the light-blocking patterns 150 may be prevented or at least reduced, and the defects due to miss-align of the light-blocking patterns 150 may be reduced. Therefore, in the 3D display apparatus according to another embodiment of the present disclosure, the quality of the 3D image provided to the user may be improved.

In the result, the 3D display apparatus according to various embodiments of the present disclosure may comprise the lower barrier layer and the upper barrier layer which are stacked between the display panel and the lenticular lenses having the curvature, wherein each of the lower barrier layer and the upper barrier layer may include the openings which are disposed on an imaginary line passing through each pixel area of the display panel and the setting region. Thus, the 3D display apparatus according to various embodiments of the present disclosure may prevent the generation of the repeated image without the quality deterioration and the decrease illuminance of the realized 3D image.

What is claimed is:
1. A three-dimensional (3D) display apparatus comprising:
a display panel including pixel areas, the display panel having a curvature;
a lower barrier layer on the display panel, the lower barrier layer including lower openings corresponding to the pixel areas;
an upper barrier layer on the lower barrier layer, the upper barrier layer including upper openings corresponding to the lower openings; and
lenses on the upper barrier layer,
wherein the lower barrier layer and the upper barrier layer have a same curvature as the display panel,
wherein a center of each upper opening from the upper openings is staggered with a center of a corresponding lower opening from the lower openings, and
wherein each of the lower openings and each of the upper openings are disposed on an imaginary line passing through a corresponding pixel area from the pixel areas and a setting region.

2. The 3D display apparatus according to claim 1, wherein the lower barrier layer, the upper barrier layer, and the lenses have a same curvature as the curvature of the display panel.

3. The 3D display apparatus according to claim 1, wherein, a Y axis is defined as a line passing through a curvature center of the display panel and the setting region, and a X axis is defined as a line passing through the curvature center of the display panel in a direction perpendicular to the Y axis, and wherein an upper opening corresponding to the pixel area having the position coordinates of ($PA_x$, $PA_y$) has position coordinates of ($OP_x$, $OP_y$) satisfying equations 1 to 3 where R is a curvature radius of the display panel, $g_2$ is a straight distance between the pixel area of the display panel and the upper barrier layer, and D is a straight distance between a center position of the display panel and the setting region.

$$OP_x = \frac{\sqrt{m_1^2(g_2+R)^2 + (g^2-D)(g_2+D+2R)} - m_1(R+D)}{m_1^2+1}$$ [Equation 1]

$$OP_y = m_1 OP_x + (R+D)$$ [Equation 2]

$$m_1 = \frac{PA_y - (R+D)}{PA_x}$$ [Equation 3]

4. The 3D display apparatus according to claim 3, wherein the curvature center of the display panel has position coordinates of (0, 0), and the setting region has position coordinates of (0, R+D).

5. The 3D display apparatus according to claim 3, wherein the pixel areas include a first pixel area and a second pixel area adjacent the first pixel area, wherein the upper openings include a first upper opening corresponding to the first pixel area and a second upper opening corresponding to the second pixel area, and wherein the lower barrier layer includes a barrier pattern which is disposed on an imaginary line passing through a halfway point between the first pixel area and the second pixel area, and a halfway point between the first upper opening and the second upper opening.

6. The 3D display apparatus according to claim 5, wherein, the first pixel has position coordinates of ($PA1_x$, $PA1_y$), the second pixel has position coordinates of ($PA2_x$, $PA2_y$), the first upper openings has position coordinates of ($Op1_x$, $Op1_y$), and the second upper openings has position coordinates of ($OP2_x$, $OP2_y$), and wherein the barrier pattern has position coordinates of ($BP_x$, $BP_y$) satisfying equations 4 to 7 where $g_1$ is a straight distance between the pixel area of the display panel and the lower barrier layer.

$$BP_x = \frac{\sqrt{m_2^2 c^2 + (R+g_1-c)(R+g_1+c)} - m_2 c}{m_2^2+1}$$ [Equation 4]

$$BP_y = m_2 BP_x + c$$ [Equation 5]

$$m_2 = \frac{PA1_y + PA2_y - OP1_y - OP2_y}{PA1_x + PA2_x - OP1_x - OP2_x}$$ [Equation 6]

$$c = \frac{PA1_y + PA2_y}{2} - \frac{m_2(PA1_x + PA2_x)}{2}$$ [Equation 7]

7. The 3D display apparatus according to claim 1, wherein a width of each upper opening from the upper openings is the same as a width of a corresponding lower opening from the lower openings.

8. The 3D display apparatus according to claim 7, wherein a width of each lower opening from the lower openings is the same as a width of a corresponding pixel area.

9. A three-dimensional (3D) display apparatus comprising:
- a display panel including pixel areas, the pixel areas disposed side by side in a first direction and a second direction perpendicular to the first direction;
- a lower barrier layer on the display panel, the lower barrier layer including lower openings corresponding to the pixel areas;
- an upper barrier layer on the lower barrier layer, the upper barrier layer including upper openings corresponding to the lower openings; and
- lenses on the upper barrier layer, each of the lenses extending obliquely to the first direction, and wherein each of the lower openings and each of the upper openings are disposed on an imaginary line passing through a corresponding pixel area from the pixel areas and a setting region, wherein the display panel includes light-blocking patterns overlapping with a boundary of the lenses, and wherein the display panel includes light-blocking patterns overlapping with a boundary of the lenses.

10. The 3D display apparatus according to claim 9, wherein each of the light-blocking patterns extends in a same direction as the lenses.

11. The 3D display apparatus according to claim 9, wherein the display panel includes a light-emitting device on a device substrate and an encapsulating element on the light-emitting device, and wherein the light-blocking patterns are disposed in the encapsulating element.

12. The 3D display apparatus according to claim 11, further comprising a quarter-wave plate and a linear polarizing plate, which are stacked between the upper barrier layer and the lenses, wherein the lower barrier layer is in contact with the encapsulating element and the upper barrier layer.

13. A three-dimensional (3D) display apparatus comprising:
- a display panel including pixel areas, the display panel having a curvature;
- a lower barrier layer on the display panel, the lower barrier layer including lower openings corresponding to the pixel areas;
- an upper barrier layer on the lower barrier layer, the upper barrier layer including upper openings corresponding to the lower openings; and
- lenses on the upper barrier layer, wherein each of the lower openings and each of the upper openings are disposed on an imaginary line passing through a corresponding pixel area from the pixel areas and a setting region, wherein each of the upper openings is spaced away from the imaginary line passing through a curvature center of the display panel and the setting region by a first straight distance, when the display panel and the upper barrier layer are spread flat, wherein each of the upper openings is spaced away from the imaginary line passing through the curvature center of the display panel and the setting region by a second straight distance, when the display panel and the upper barrier layer have the curvature of the display panel, and wherein the first straight distance is less than the second straight distance.

14. The 3D display apparatus according to claim 13, wherein, a Y axis is defined as a line passing through the curvature center of the display panel and the setting region, and a X axis is defined as a line passing through the curvature center of the display panel in a direction perpendicular to the Y axis, and wherein the upper opening having position coordinates of ($OP_x$, $OP_y$) is spaced away from the imaginary line passing through a curvature center of the display panel and the setting region by the straight distance $d_{cal}$ satisfying equations 8 and 9 where R is a curvature radius of the display panel, $g_2$ is a straight distance between the pixel area of the display panel and the upper barrier layer, and $d_{on}$ is an arc distance between an imaginary line passing through a center position of the display panel and the setting region and the upper opening, when the display panel and the upper barrier layer have the curvature of the display panel.

$$d_{cal} = \frac{R}{R + g_2} d_{ori} \quad \text{[Equation 8]}$$

* * * * *